United States Patent
Shah

(10) Patent No.: US 10,348,039 B1
(45) Date of Patent: Jul. 9, 2019

(54) CONNECTOR SHIELDING

(71) Applicant: Microsoft Technology Licensing, LLC, Redmond, WA (US)

(72) Inventor: Akash Atul Shah, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/942,271

(22) Filed: Mar. 30, 2018

(51) Int. Cl.
| | |
|---|---|
| *H01R 12/00* | (2006.01) |
| *H01R 13/6596* | (2011.01) |
| *H01R 13/24* | (2006.01) |
| *H01R 13/6471* | (2011.01) |
| *H01R 12/72* | (2011.01) |

(52) U.S. Cl.
CPC ....... *H01R 13/6596* (2013.01); *H01R 12/721* (2013.01); *H01R 13/2442* (2013.01); *H01R 13/6471* (2013.01)

(58) Field of Classification Search
CPC ............ H01R 13/2442; H01R 13/6471; H01R 13/6596; H01R 12/721
USPC .......................................................... 439/59
See application file for complete search history.

(56) References Cited

U.S. PATENT DOCUMENTS

| | | | | |
|---|---|---|---|---|
| 5,425,651 A * | 6/1995 | Thrush | ................... | H01R 12/83 439/326 |
| 5,766,041 A | 6/1998 | Morin et al. | | |
| 6,347,962 B1 | 2/2002 | Kline | | |
| 6,358,091 B1 * | 3/2002 | Lo | ......................... | H01R 9/035 439/607.06 |
| 6,468,089 B1 * | 10/2002 | Hubbard | ................ | H01R 24/50 439/63 |
| 6,752,663 B2 * | 6/2004 | Bright | .................. | G02B 6/4201 439/607.25 |
| 6,816,376 B2 * | 11/2004 | Bright | .................. | G02B 6/4201 361/704 |
| 7,014,475 B1 * | 3/2006 | Mongold | ............. | H01R 12/721 439/67 |
| 7,114,857 B1 * | 10/2006 | Kayner | ................ | G02B 6/4246 385/88 |
| 7,160,117 B2 * | 1/2007 | Ngo | ..................... | H01R 13/514 439/76.1 |
| 7,303,442 B2 * | 12/2007 | Fan | ..................... | H01R 13/2442 439/326 |
| 7,762,844 B2 | 7/2010 | Ice | | |

(Continued)

OTHER PUBLICATIONS

"EMI Filtered Connectors", Retrieved from: <<https://www.mousercom/ds/2/382/emi-filtered-connectors-372181.pdf>>, Retrieved on: Nov. 6, 2017, 63 Pages.

(Continued)

*Primary Examiner* — Abdullah A Riyami
*Assistant Examiner* — Vladimir Imas
(74) *Attorney, Agent, or Firm* — Holzer Patel Drennan

(57) ABSTRACT

The described technology provides a removable apparatus comprising a printed circuit board (PCB) including a plurality of electrical components, a plurality of contact pads configured on at least one of a top surface of a connector plane and a bottom surface of a connector plane to connect the electrical components to one or more contact pins of a receptacle, and one or more ground pads configured to be connected to the one or more contact pins of the receptacle, wherein the one or more ground pads are placed in between the PCB and the plurality of contact pads and connected to a ground terminal of the PCB.

19 Claims, 7 Drawing Sheets

(56) References Cited

U.S. PATENT DOCUMENTS

| | | | | |
|---|---|---|---|---|
| 7,798,820 B2* | 9/2010 | Hong | .................... | H05K 1/117 385/92 |
| 7,833,068 B2* | 11/2010 | Bright | ................ | H01R 13/502 439/733.1 |
| 7,866,993 B2* | 1/2011 | Ohsumi | ............... | H01R 12/721 439/141 |
| 7,909,654 B2* | 3/2011 | He | .................... | H01R 13/6658 439/607.22 |
| 7,988,460 B1* | 8/2011 | Chiu | ................. | H01R 13/6658 439/660 |
| 8,167,631 B2* | 5/2012 | Ito | .......................... | H01R 24/38 439/108 |
| 8,292,669 B2* | 10/2012 | Wang | ................. | H01R 13/514 439/607.2 |
| 8,353,707 B2* | 1/2013 | Wang | ................ | H01R 13/6658 439/60 |
| 8,475,210 B2* | 7/2013 | Wang | ................ | H01R 13/6658 439/607.31 |
| 8,506,330 B2 | 8/2013 | Mizukami et al. | | |
| 8,506,333 B2* | 8/2013 | Wang | ................. | H01R 12/721 439/626 |
| 8,727,793 B2* | 5/2014 | Cafiero | ................ | G02B 6/4201 439/540.1 |
| 8,764,464 B2* | 7/2014 | Buck | .................... | H01R 13/514 439/108 |
| 8,834,205 B2 | 9/2014 | Fogg et al. | | |
| 8,851,908 B1* | 10/2014 | Leiba | .................... | H01R 12/53 439/92 |
| 9,153,920 B2* | 10/2015 | Kamei | ................... | H01R 24/60 |
| 9,397,427 B2* | 7/2016 | Ho | ........................ | H01R 12/721 |
| 9,570,824 B1* | 2/2017 | Chien | ................ | H01R 12/7076 |
| 9,622,394 B1 | 4/2017 | Frank et al. | | |
| 9,748,697 B2* | 8/2017 | Patel | ................... | H01R 13/6471 |
| 9,800,350 B2* | 10/2017 | Ko | ........................ | H04B 10/60 |
| 9,859,661 B2* | 1/2018 | Park | .................... | H01R 13/6585 |
| 9,991,616 B2* | 6/2018 | Axelowitz | ............ | H01R 12/721 |
| 9,997,853 B2* | 6/2018 | Little | ................. | H01R 13/6471 |
| 2008/0070439 A1* | 3/2008 | Kusuda | ................ | H01R 12/725 439/540.1 |
| 2012/0129402 A1* | 5/2012 | Wang | ................... | H01R 12/721 439/629 |

OTHER PUBLICATIONS

"EMI Shielding Applications", Retrieved from: <<https://web.archive.org/web/20171116004707/https:/hollandshielding.com/EMI-shielding-applications>>, Nov. 16, 2017, 8 Pages.

* cited by examiner

CONNECTOR SHIELDING

BACKGROUND

Removable modules for computing devices are increasingly used to increase one or capabilities of the computing devices. For example, removable storage expansion cards are used to increase random access memory (RAM) capacity of the computing device. Similarly, removable solid-state drive (SSD) cards are used to increase the data protection, reparability, and upgradability of tablet devices.

SUMMARY

The described technology provides a removable apparatus comprising a printed circuit board (PCB) including a plurality of electrical components, a plurality of contact pads configured on at least one of a top surface of a connector plane and a bottom surface of the connector plane to connect the electrical components to one or more contact pins of a receptacle, and one or more ground pads configured to be connected to the one or more contact pins of the receptacle, wherein the one or more ground pads are placed in between the PCB and the plurality of contact pads and connected to a ground terminal of the PCB.

The above presents a simplified summary of the innovation in order to provide a basic understanding of some aspects described herein. This summary is not an extensive overview of the claimed subject matter. It is intended to neither identify key or critical elements of the claimed subject matter nor delineate the scope of the subject innovation. Its sole purpose is to present some concepts of the claimed subject matter in a simplified form as a prelude to the more detailed description that is presented later.

Other implementations are also described and recited herein.

BRIEF DESCRIPTIONS OF THE DRAWINGS

Example embodiments are illustrated in referenced figures of the drawings. It is intended that the embodiments and figures disclosed herein are to be considered illustrative rather than restrictive.

DETAILED DESCRIPTIONS

Figure 1:
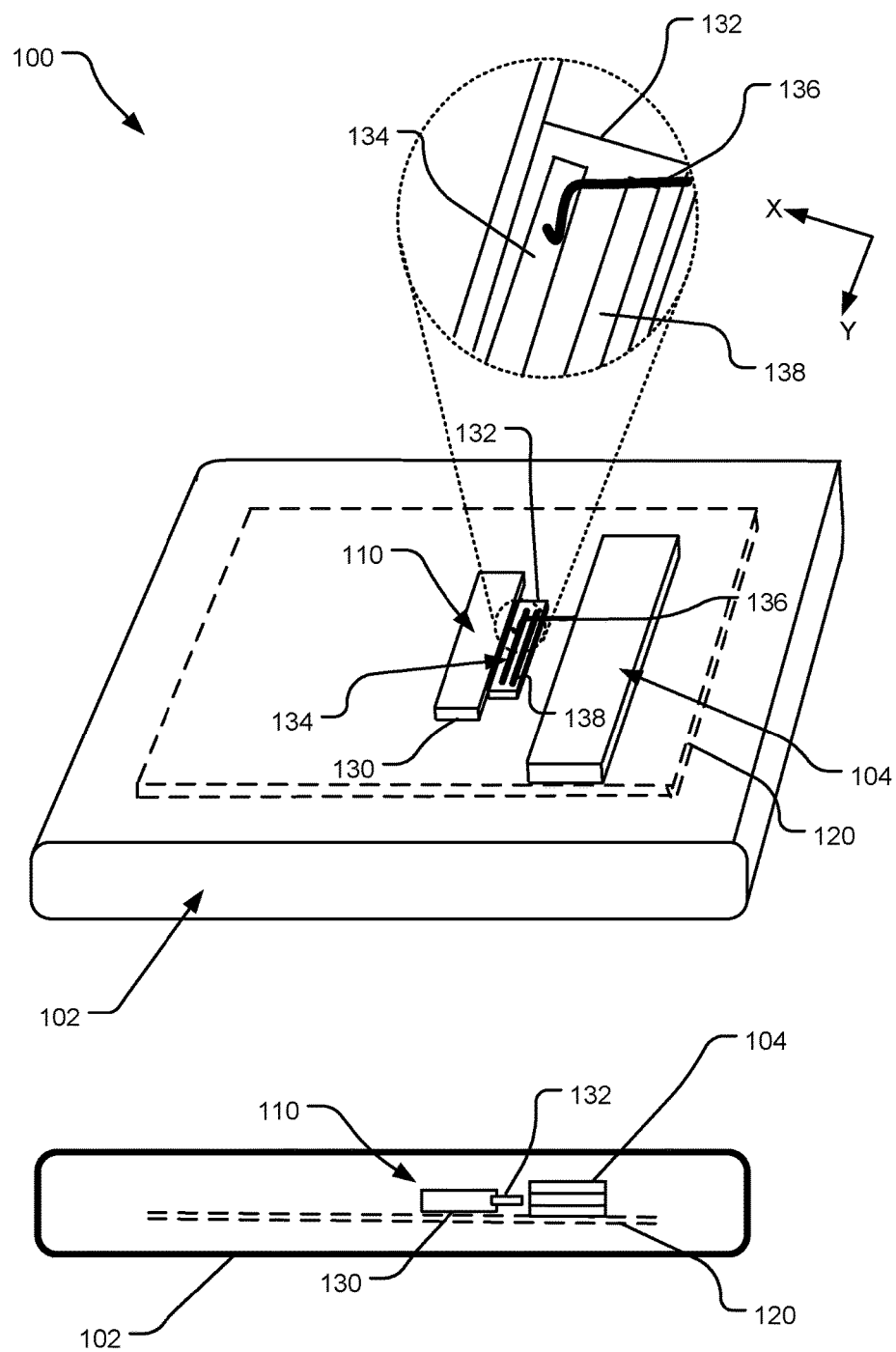
FIG. 1 illustrates an example computing apparatus including a removable module using connector shielding in a manner disclosed herein.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. The claimed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the claimed subject matter may be practiced without these specific details. In other instances, well-known structures and devices are shown in block diagram form in order to facilitate describing the subject innovation.

Removable modules for computing devices are increasingly used to increase one or capabilities of the computing devices. For example, removable storage expansion cards are used to increase random access memory (RAM) capacity of the computing device. Similarly, removable solid-state drive (SSD) cards are used to increase the data protection, reparability, and upgradability of tablet devices. State of the art computing devices, such as tablets, require very high speed communication capabilities using communication protocols such as Wi-Fi, Bluetooth, and long-term evolution (LTE) standards.

However, such communication protocols may be incompatible for being used with removable modules due to the noisy radio-frequency (RF) emissions generated by various high speed components of the removable modules. Specifically, the connectors of the removable modules may not be shielded properly so as to reduce or remove the RF noise emanating from the connection points between the removable modules and the electrical components of the receptacle of the system. The implementations disclosed herein provide shielding to the connectors of the removable modules to reduce the RF noise emanating therefrom.

FIG. 1 is an illustration of a computing apparatus 100 including a removable module using connector shielding in a manner disclosed herein. Specifically, the input component 102 of the computing device 100 is shown to have a receptacle 104 that is configured to connect to a removable apparatus 110. In one implementation, the receptacle 104 may be affixed to a motherboard 120 of the computing device. The removable apparatus 110 including a component module 130 and a connector plane 132 may be used to increase one or more capabilities of the computing device 100. The component module 130 may house a PCB (such as the PCB 214 disclosed in FIG. 2). For example, the removable apparatus 110 may be a removable RAM card where the component module 130 houses RAM and the connector plane 132 is used to communicatively connect the RAM to the receptacle 104 and therefore to the motherboard 120.

In an implementation disclosed herein, the connector plane 132 is configured to have a connector shielding using one of the various implementations disclosed herein so as to reduce any RF noise generated by the operation of the removable apparatus 110. For example, the connector plane 132 may include a plurality of contact pads 138 that are connected to the components of the component module 130. In one implementation, the connector plane 132 may also include a ground pad 134 that is configured to connect to a ground contact pin 136 of the receptacle. Specifically, the ground pad 134 may be placed in front of the component module 130 before the plurality of contact pads 138. In other words, the ground pad 134 may be placed in between the plurality of contact pads 138 and the component module 130. As a result, the ground contact pin 136 of the receptacle 104 touches the ground pad 134 while extending over the plurality of contact pads 138. Specifically, when the ground contact pin 136 is provided such that is substantially spans the width of the connector plane 132 (along the Y axis), it is more effective in reducing the RF noise generated by the assembly of the removable apparatus 110, the connector plane 132, and the receptacle 104.

While the illustrated implementation of FIG. 1 has a single ground pad 134 extending across the width of the connector plane 132, in alternative implementation, one or more of the plurality of contact pads 138 may be ground contact pads and in that case such ground contact pads are extended towards the component nodule 130 so that the ground contact pin 136 of the receptacle may be in contact with such extended ground contact pad. Furthermore, while the illustrated implementation in FIG. 1 discloses one ground contact pin 136 extending from the receptacle 104, in alternative implementations, a plurality of ground contact pins 136 may be provided such that these ground contact pins 136 connect with a single ground pad 136 or a plurality of ground contact pads extended towards the component module 130. In one implementation, the ground contact pin 136 may be a high speed electrical contact pin that supports communication over a wide frequency band.

By shielding the PCB of the removable apparatus 110, the connector plane 132, and the receptacle 104, the implementation disclosed herein eliminates almost all RF noise. However, if there are other RF noise sources present in the input component 102, the implementation disclosed herein may not affect the RF noise emanating from sources other than the removable apparatus 110, the connector plane 132, and the receptacle 104.

Figure 2:
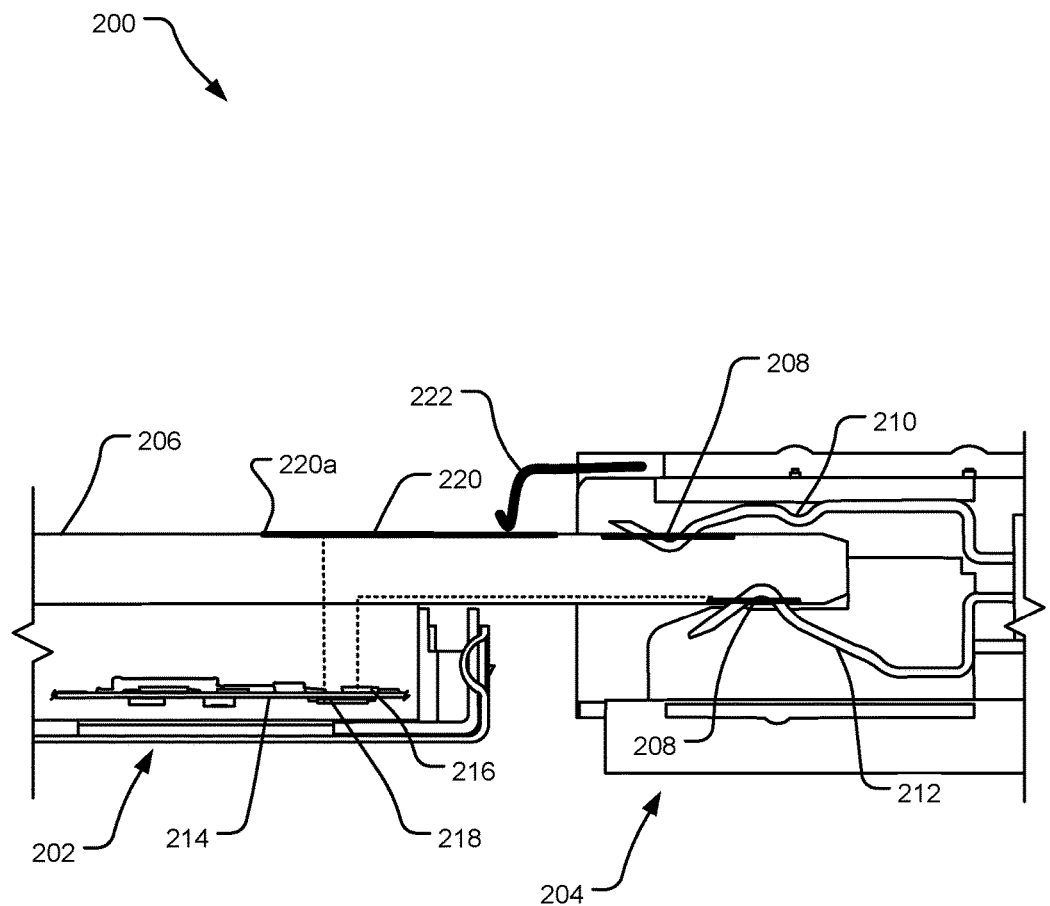
FIG. 2 illustrates a side view of an example assembly of a component module and a receptacle using the shielding connector disclosed herein.

FIG. 2 illustrates a side view of an example assembly 200 of a component module 202 and a receptacle 204 using the connector shielding disclosed herein. The component module 202 includes a connector plane 206 which may have one or contact pads 208 for communicatively connecting components from the component module 202 with contact pins 210 and 212 of the receptacle 204. While the illustrated implementation shows the contact pads 208 on both the top surface and the bottom surface of the connector plane 206, in alternative implementations, the contact pads 208 may be located only on one of the top surface and the bottom surface of the connector plane 206. The component module 202 may house a PCB 214 with one or more components and one or more ground terminals. For example, a component 216 may be connected to the contact pad 208, another component 218 may be a ground terminal.

The example assembly 200 also includes a ground pad 220 that is configured in front of the pads 208. Thus, the ground pad 220 is configured between various components of the component module 202 and the contact pads 208. In one implementation, the ground pad 220 may be connected with the ground surface of the component module 202. A ground contact pin 222 that is connected to the housing of the receptacle 204 may be in configured such that when the component module 202 is inserted into the receptacle 204, the ground contact pin 222 is in touch with the ground pad 220 on the connector plane 206. The back end 220a of the ground pad 220 may be connected to one or more ground terminals internal to the component module 202.

The housing of the receptacle 204 may also be grounded via a ground terminal in the receptacle 204. This provides a ground connection between the ground terminal of the component module 202 and the ground terminal of the receptacle 204 via the ground pad 220, the ground contact pin 222, and the housing of the receptacle 204. The combination of the ground pad 220 and the ground contact pin 222 provides connector shielding to the contact pads 208 such that the contact pads 208 do not generate any RF noise that may interfere with various communication capabilities of the computing device hosting the assembly 200.

Figure 3:
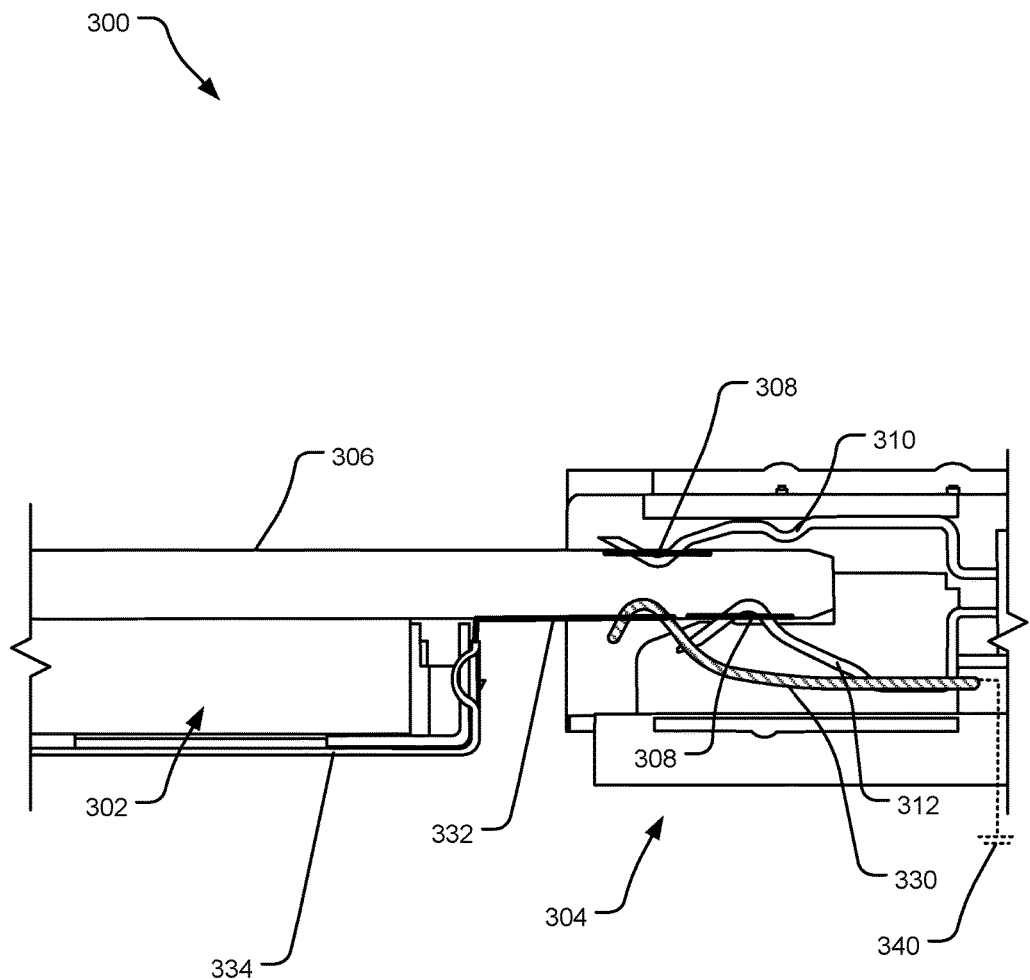
FIG. 3 illustrates a side view of an alternative example assembly of a component module and a receptacle using the shielding connector disclosed herein.

FIG. 3 illustrates a side view of an example assembly 300 of a component module 302 and a receptacle 304 using the connector shielding disclosed herein. The component module 302 includes a connector plane 306 which may have one or contact pads 308 for communicatively connecting components from the component module 302 with contact pins 310 and 312 of the receptacle 304. The connector plane 306 may include one or more contact pads 308 on its surface that are communicatively connected to various component within the component module 302. When the connector plane 306 of the component module 302 is inserted into the receptacle 304, contact pins 310 and 312 of the receptacle 304 may connect with the contact pads 308.

In the illustrated implementation, the connector plane 306 also includes a ground pad 332 that is configured between various components of the component module 302 and the contact pads 308. The ground pad 332 may be connected via a chassis 334 of the component module 302 to a ground terminal of the component module 302. Furthermore, the receptacle 304 may include a ground contact pin 330 that may be in contact with the ground pad 332 to provide a ground connection to a ground terminal 340 of the receptacle 304. The combination of the ground pad 332 and the ground contact pin 330 provides shielding to the assembly 300 so that the RF noise generated from the assembly 300 is mitigated.

Figure 4:
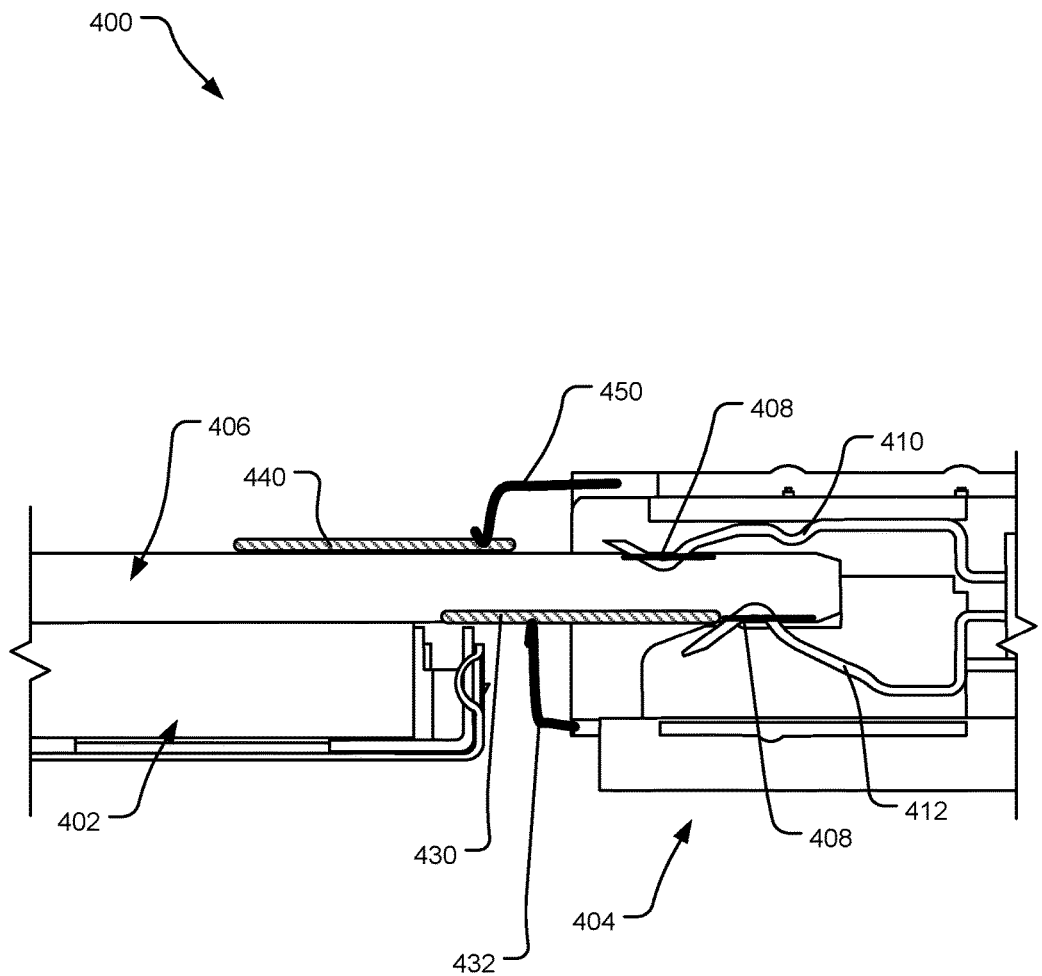
FIG. 4 illustrates a side view of another example assembly of a component module and a receptacle using the shielding connector disclosed herein.

FIG. 4 illustrates a side view of another example assembly 400 of a component module 402 and a receptacle 404 using the shielding connector disclosed herein. The component module 402 includes a connector plane 406 which may have one or contact pads 408 for communicatively connecting components from the component module 402 with contact pins 410 and 412 of the receptacle 404.

In the example assembly 400, the connector plane 406 also includes a bottom ground pad 430 and a top ground pad 440, respectively configured on a top surface of the connector plane 406 and on a bottom surface of the connector lane 406. Each of the bottom ground pad 430 and the top ground pad 440 are configured to be in front of the component module 402 before the contact pads 408. In one configuration, if one or more of the contact pads 408 are ground pads, such ground pads may be extended towards the component module 402 and may serve as the bottom ground pad 430 or the top ground pad 440.

Furthermore, the shell of the receptacle 404 may be extended on both the top and the bottom surface using shell extensions to provide a top ground connector pin 450 and a bottom ground connector pin 432. Specifically, the bottom ground connector pin 432 may be in contact with the ground contact pad 430, when the connector module 402 is assembled together with the receptacle 404. Similarly, when the connector module 402 is assembled together with the receptacle 404, the top ground connector pin 450 may be in contact with the top contact pad 440. The combination of the bottom ground pad 430 and the top ground pad 440 and their respective connections with the bottom ground connector pin 432 and the top ground connector pin 450 forms connector shielding that mitigates RF noise generated from the use of the assembly 400.

Figure 5:
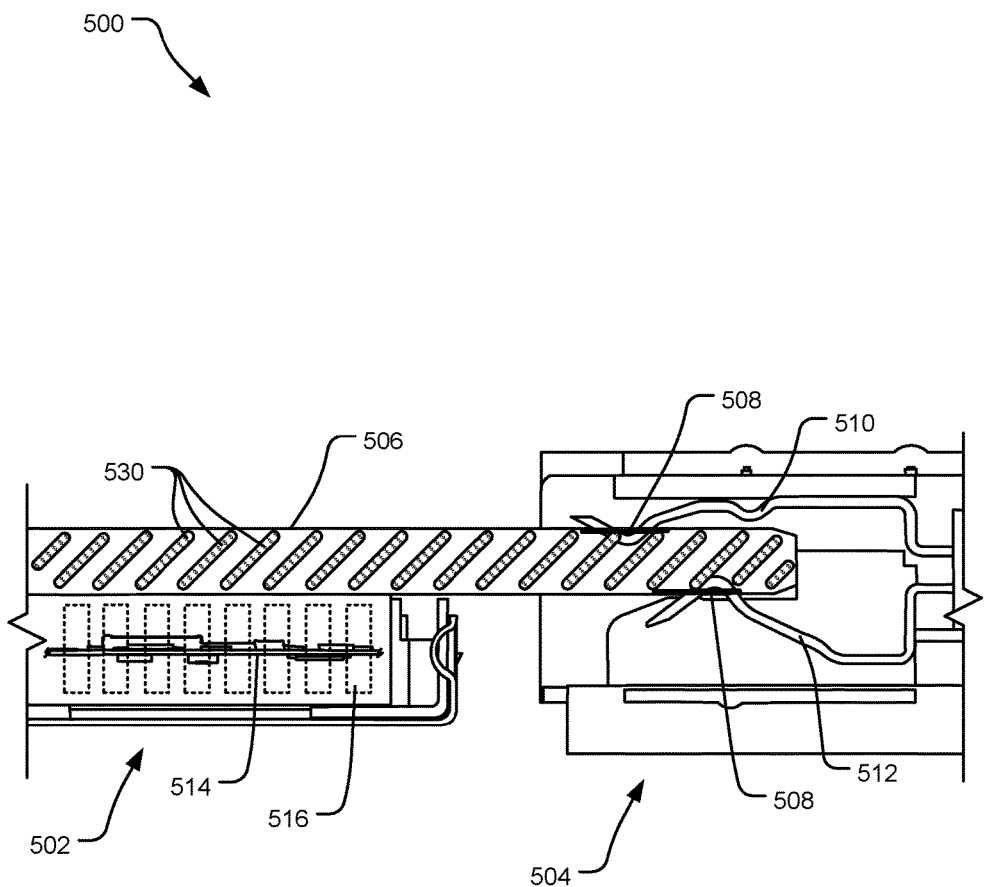
FIG. 5 illustrates a side view of another example assembly of a component module and a receptacle using the shielding connector disclosed herein.

FIG. 5 illustrates a side view of another assembly 500 of a component module 502 and a receptacle 504 using the shielding connector disclosed herein. The component module 502 includes a connector plane 506 which may have one or contact pads 508 for communicatively connecting components from the component module 502 with contact pins 510 and 512 of the receptacle 504. Furthermore, in the illustrated implementation, the connector plane 506 is provided with side plating 530 that is connected with one or more ground contacts within the connector module 502, thus providing connector shielding to mitigate any RF noise generated due to the use of the assembly 500. In one implementation, the side plating 530 may be implemented using vias across a perimeter of the connector plane 506 of the component module 502. In an alternative implementation, physical plating 516 may be provided along the vertical edges of a PCB 514 housed in the component module 502. In such an implementation, the physical plating 516 may be connected to a ground terminal of the PCB 514.

In one implementation, the side plating 530 may be connected to a ground of the receptacle 504. Specifically, in such an implementation, the ground plane of the side plating 530 may be common with the ground plane of top and bottom ground pads near the connector plane 506 of the removable module 502, where such top and bottom ground pads connect to a ground connect of the receptacle 504. However, in an alternative implementation, the side plating 530 may not be connected to a ground of the receptacle 504. Specifically, in such an implementation.

Figure 6:
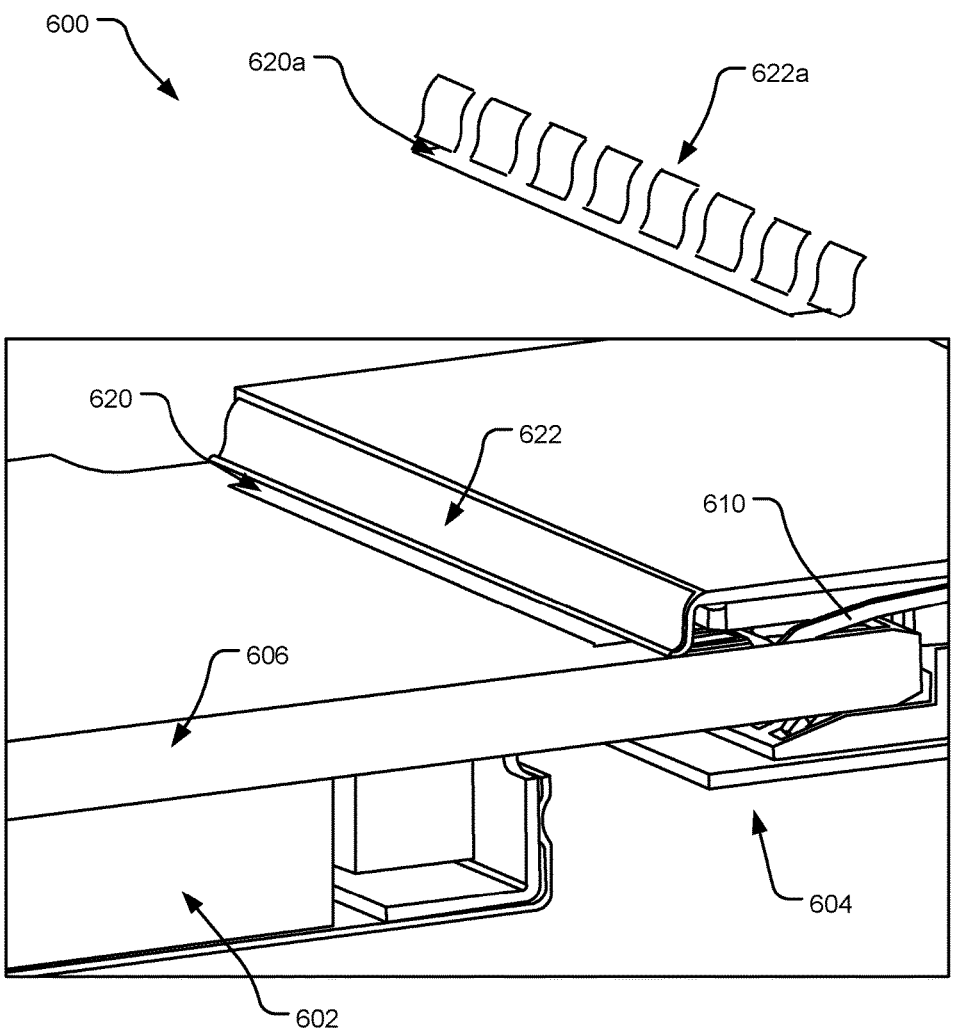
FIG. 6 illustrates an isometric view of an example assembly of a component module and a receptacle using the shielding connector disclosed herein.

FIG. 6 illustrates an isometric view of an assembly 600 of a component module 620 and a receptacle 604 using the shielding connector disclosed herein. The component module 602 may include a connector plane 606 with a ground pad 620, where the ground pad 620 may be connected with one or more ground terminals of the component module 602. Specifically, the ground pad 620 may be configured in front of other connector pads configured on the connector plane 606. The receptacle 604 may include a contact pin 610 that may connect with the contact pads on the connector plane 606. A shell extension 622 that extends the shell of the receptacle 604 may be in contact with the ground pad 620 on the connector plane 606. The combination of the shell extension 622, which may be connected with a ground terminal of the receptacle 604, and the ground pad 620 provides a connector shielding to mitigate RF noise from the operation of the assembly 600. In such an implementation, the shell extension 622 may be a single flange extending across the width of the connector plane 606 or it may be a plurality of flanges as illustrated by the shell extension 622a in conjunction with ground pad 620a. In another implementation, the shell extension 622 may be provided on a bottom shell of the receptacle 604 such that is connects with ground pads on a bottom surface of the removable module 602.

Figure 7:
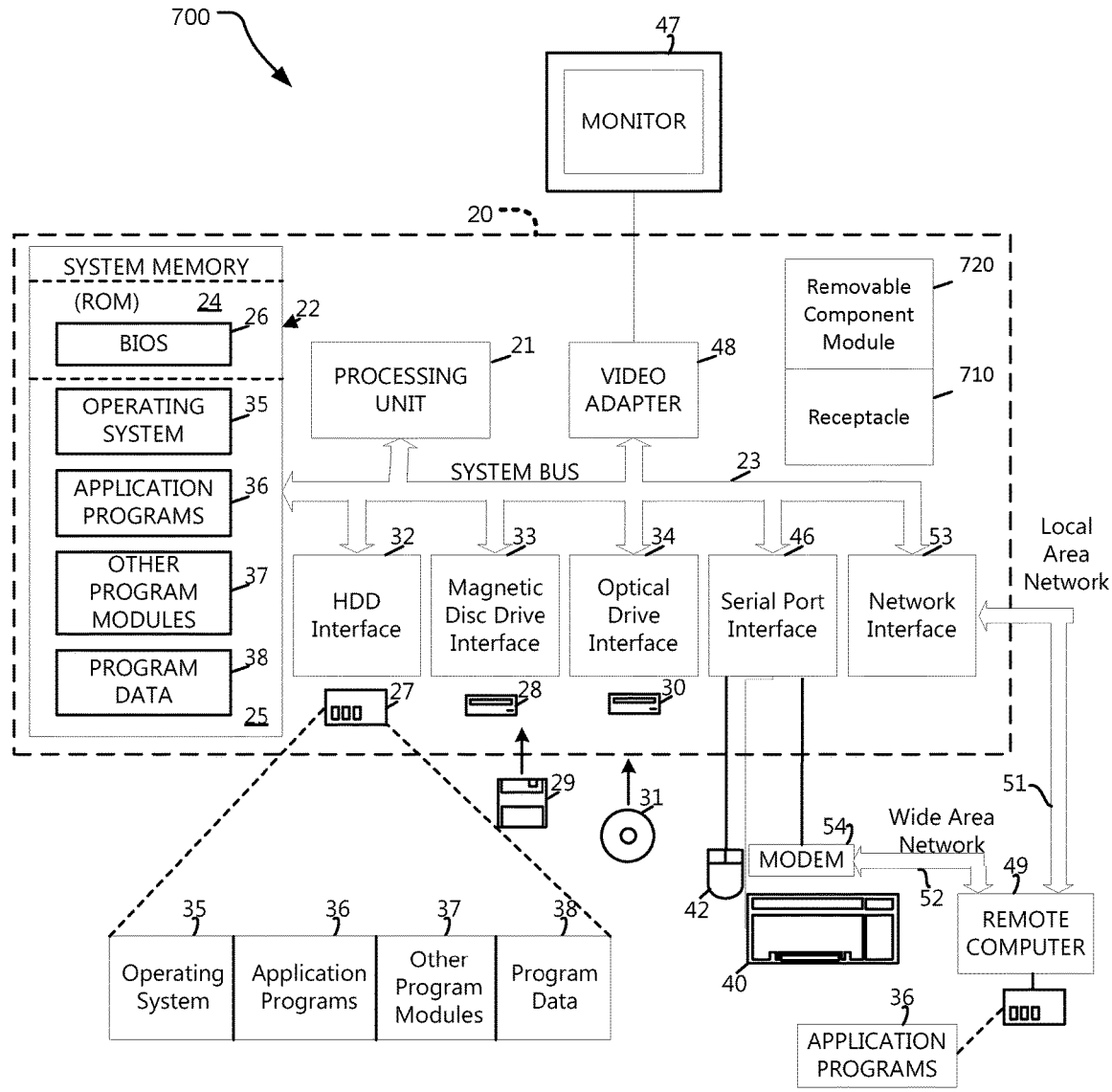
FIG. 7 illustrates an example computing device that may use the removable module disclosed herein.

FIG. 7 illustrates an example system 700 that may be useful in implementing the integrated input component disclosed herein. The example hardware and operating environment of FIG. 7 for implementing the described technology includes a computing device, such as a general-purpose computing device in the form of a computer 20, a mobile telephone, a personal data assistant (PDA), a tablet, smart watch, gaming remote, or other type of computing device. In the implementation of FIG. 7, for example, the computer 20 includes a processing unit 21, a system memory 22, and a system bus 23 that operatively couples various system components including the system memory to the processing unit 21. There may be only one or there may be more than one processing unit 21, such that the processor of a computer 20 comprises a single central-processing unit (CPU), or a plurality of processing units, commonly referred to as a parallel processing environment. The computer 20 may be a conventional computer, a distributed computer, or any other type of computer; the implementations are not so limited.

In the example implementation of the computing system 700, the computer 20 also includes a receptacle 710 such as the receptacle 204 disclosed herein. The receptacle 710 may communicate with a removable component module 720 such as the component module 202 disclosed herein.

The system bus 23 may be any of several types of bus structures including a memory bus or memory controller, a peripheral bus, a switched fabric, point-to-point connections, and a local bus using any of a variety of bus architectures. The system memory may also be referred to as simply the memory and includes read-only memory (ROM) 24 and random access memory (RAM) 25. A basic input/output system (BIOS) 26, containing the basic routines that help to transfer information between elements within the computer 20, such as during start-up, is stored in ROM 24. The computer 20 further includes a hard disk drive 27 for reading from and writing to a hard disk a magnetic disk drive 28 for reading from or writing to a removable magnetic disk 29, and an optical disk drive 30 for reading from or writing to a removable optical disk 31 such as a CD ROM, DVD, or other optical media.

The computer 20 may be used to implement an integrated input component as disclosed herein. In one implementation, one or more instructions to interpret signal outputs generated by the integrated input component 1210 may be stored in memory of the computer 20, such as the read-only memory (ROM) 24 and random access memory (RAM) 25.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated tangible computer-readable media provide nonvolatile storage of computer-readable instructions, data structures, program modules and other data for the computer 20. It should be appreciated by those skilled in the art that any type of tangible computer-readable media may be used in the example operating environment.

A number of program modules may be stored on the hard disk, magnetic disk 29, optical disk 31, ROM 24, or RAM 25, including an operating system 35, one or more application programs 36, other program modules 37, and program data 38. A user may generate reminders on the personal computer 20 through input devices such as a keyboard 40 and pointing device 42. Other input devices may include a microphone (e.g., for voice input), a camera (e.g., for a natural user interface (NUI)), a joystick, a game pad, a satellite dish, a scanner, or the like. These and other input devices are often connected to the processing unit 21 through a serial port interface 46 that is coupled to the system bus, but may be connected by other interfaces, such as a parallel port, game port, or a universal serial bus (USB). A monitor 47 or other type of display device is also connected to the system bus 23 via an interface, such as a video adapter 48. In addition to the monitor, computers typically include other peripheral output devices, such as speakers and printers.

The computer 20 may operate in a networked environment using logical connections to one or more remote computers, such as remote computer 49. These logical connections are achieved by a communication device coupled to or a part of the computer 20; the implementations are not limited to a particular type of communications device. The remote computer 49 may be another computer, a server, a router, a network PC, a client, a peer device or other common network node, and typically includes many or all of the elements described above relative to the computer 20. The logical connections depicted in FIG. 10 include a local-area network (LAN) 51 and a wide-area network (WAN) 52. Such networking environments are commonplace in office networks, enterprise-wide computer networks, intranets and the Internet, which are all types of networks.

When used in a LAN-networking environment, the computer 20 is connected to the local area network 51 through a network interface or adapter 53, which is one type of communications device. When used in a WAN-networking environment, the computer 20 typically includes a modem 54, a network adapter, a type of communications device, or any other type of communications device for establishing communications over the wide area network 52. The modem 54, which may be internal or external, is connected to the system bus 23 via the serial port interface 46. In a networked environment, program engines depicted relative to the personal computer 20, or portions thereof, may be stored in the remote memory storage device. It is appreciated that the network connections shown are example and other means of communications devices for establishing a communications link between the computers may be used.

In an example implementation, software or firmware instructions may be stored in system memory 22 and/or storage devices 29 or 31 and processed by the processing unit 21. integrated input component output and data may be stored in system memory 22 and/or storage devices 29 or 31 as persistent data-stores.

In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some embodiments of the integrated input component system may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

The integrated input component system disclosed herein may include a variety of tangible computer-readable storage media and intangible computer-readable communication signals. Tangible computer-readable storage can be embodied by any available media that can be accessed by the integrated input component system disclosed herein and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the integrated input component system disclosed herein. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals moving through wired media such as a wired network or direct-wired connection, and signals moving through wireless media such as acoustic, RF, infrared and other wireless media.

A removable apparatus disclosed herein includes a printed circuit board (PCB) including a plurality of electrical components, a plurality of contact pads configured on at least one of a top surface of a connector plane and a bottom surface of a connector plane to connect the electrical components to one or more contact pins of a receptacle, and one or more ground pads configured to be connected to the one or more contact pins of the receptacle, wherein the one or more ground pads are placed in between the PCB and the plurality of contact pads and connected to a ground terminal of the PCB. In one implementation, the one or more ground pads includes a single ground pad expanding along a width of the connector plane of the component module.

In an alternative implementation, the one or more ground pads are configured to be connected to a shell (or shield) extension of the receptacle. Yet alternatively, the one or more ground pads are configured on each of the top surface of the connector plane and the bottom surface of the connector plane. In another implementation, a side plating is implemented using at least one of vias across a perimeter of the removable module and physical plating across along vertical edges of the PCB. In yet another implementation, the one of more ground pads are extended from one or more contact pads in the direction away from the receptacle. Alternatively, the connector plane further comprising a side plating that is connected with one or more ground contacts within the removable apparatus. In another implementation, one of the ground pads is connected to a chassis of the removable apparatus.

A receptacle for connecting with a removable apparatus includes a plurality of contacts pins configured to connect to one or more of a plurality of contact pads of the removable apparatus and a shell extension extending over one or more of the plurality of contact pads to connect with a ground pad on a top surface of a connector plane of the removable apparatus. An alternative implementation includes a ground contact pin configured to extend over the one or more of the plurality of contact pads to connect with a ground pad on a bottom surface of the connector plane of the removable apparatus. In an alternative implementation the ground contact pin is connected to a ground terminal of the receptacle.

In another implementation, the receptacle further includes a second shell extension extending over the one or more of the plurality of contact pads to connect with a ground pad on a bottom surface of the connector plane of the removable apparatus. Yet alternatively, the shell extension is connected to a ground terminal of the receptacle.

An apparatus disclosed herein includes a component module including a connector plane with a plurality of contact pads and one or more ground pads located away from a receptacle and the receptacle including a plurality of contacts pins configured to connect to the one or more of the plurality of contact pads of the component module. An alternative implementation further includes a shell extension extending over the one or more of the plurality of contact pads to connect with one of the one or more ground pads located on a top surface of the connector plane of the component module.

In one implementation, the receptacle further includes a shell extension extending over one or more of the plurality of contact pads to connect with a ground pad located on the bottom surface of the connector plane of the component module. In another implementation, the one or more ground pads includes a single ground pad expanding along a width of the connector plane of the component module. In yet another implementation, the one or more ground pads are configured on each of the top surface of the connector plane and the bottom surface of the connector plane. Alternatively, the one or more ground pads are configured to be connected to a shell extension of the receptacle.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. A removable apparatus for a computing device, the removable apparatus comprising:
    a printed circuit board (PCB) including a plurality of electrical components;
    a plurality of contact pads configured on at least one of a top surface of a connector plane and a bottom surface of a connector plane to connect the electrical components to one or more contact pins of a receptacle; and
    one or more ground pads configured to be connected to the one or more contact pins of the receptacle, wherein one of the ground pads is connected to a chassis of the removable apparatus.

2. The removable apparatus of claim 1, wherein the one or more ground pads includes a single ground pad expanding along a width of the connector plane of a component module.

3. The removable apparatus of claim 1, wherein the one or more ground pads are configured to be connected to a shell extension of the receptacle.

4. The removable apparatus of claim 1, wherein the one or more ground pads are configured on each of the top surface of the connector plane and the bottom surface of the connector plane.

5. The removable apparatus of claim 1, wherein a side plating is implemented using at least one of vias across a perimeter of the removable apparatus and physical plating across along vertical edges of the PCB.

6. The removable apparatus of claim 1, wherein the one or more ground pads are extended from one or more contact pads in the direction away from the receptacle.

7. The removable apparatus of claim 1, wherein the connector plane further comprising a side plating that is connected with one or more ground contacts within the removable apparatus.

8. The removable apparatus of claim 1, wherein the one or more ground pads are placed in between the PCB and the plurality of contact pads and connected to a ground terminal of the PCB.

9. A receptacle for connecting with a removable apparatus, the receptacle comprising:
    a plurality of contact pins configured to connect to one or more of a plurality of contact pads of the removable apparatus;
    a shell extension extending over one or more of the plurality of contact pads to connect with a ground pad on a top surface of a connector plane of the removable apparatus, wherein the connector plane further comprising a side plating that is connected with one or more ground contacts within the removable apparatus.

10. The receptacle of claim 9, further comprising a ground contact pin configured to extend over the one or more of the plurality of contact pads to connect with a ground pad on a bottom surface of the connector plane of the removable apparatus.

11. The receptacle of claim 10, wherein the ground contact pin is connected to a ground terminal of the receptacle.

12. The receptacle of claim 9, further comprising a second shell extension extending over the one or more of the plurality of contact pads to connect with a ground pad on a bottom surface of the connector plane of the removable apparatus.

13. The receptacle of claim 9, wherein the shell extension is connected to a ground terminal of the receptacle.

14. An apparatus, comprising:
    a component module including a connector plane with a plurality of contact pads and one or more ground pads located away from a receptacle; and
    the receptacle including a plurality of contacts pins configured to connect to the one or more of the plurality of contact pads of the component module, wherein a side plating is implemented using vias across a perimeter of the component module.

15. The apparatus of claim 14, wherein the receptacle further comprising a shell extension extending over the one or more of the plurality of contact pads to connect with one of the one or more ground pads located on a top surface of the connector plane of the component module.

16. The apparatus of claim 14, wherein the receptacle further comprising a shell extension extending over one or more of the plurality of contact pads to connect with a ground pad located on the bottom surface of the connector plane of the component module.

17. The apparatus of claim 14, wherein the one or more ground pads includes a single ground pad expanding along a width of the connector plane of the component module.

18. The apparatus of claim 14, wherein the one or more ground pads are configured on each of the top surface of the connector plane and the bottom surface of the connector plane.

19. The apparatus of claim 14, wherein the one or more ground pads are configured to be connected to a shell extension of the receptacle.

\* \* \* \* \*